US006255231B1

(12) United States Patent
Chen et al.

(10) Patent No.: US 6,255,231 B1
(45) Date of Patent: Jul. 3, 2001

(54) METHOD FOR FORMING A GATE OXIDE LAYER

(75) Inventors: B. F. Chen, Taipei; F. Y. Lin, I-Lan; W. J. Lin, Hsin-Chu, all of (TW)

(73) Assignee: Taiwan Semiconductor Manufacturing Co., Ltd, Hsinchu (TW)

( * ) Notice: Subject to any disclaimer, the term of this patent is extended or adjusted under 35 U.S.C. 154(b) by 0 days.

(21) Appl. No.: 09/165,398

(22) Filed: Oct. 2, 1998

(51) Int. Cl.[7] .......................... H01L 21/31; H01L 21/469
(52) U.S. Cl. ............................................................. 438/773
(58) Field of Search ................................. 438/773, 770; 427/255.18, 255.27, 255.37

(56) References Cited

U.S. PATENT DOCUMENTS

| | | | |
|---|---|---|---|
| 5,777,300 | * | 7/1998 | Homma et al. ........................ 219/679 |
| 5,935,650 | * | 8/1999 | Lerch et al. ........................ 427/255.4 |

OTHER PUBLICATIONS

Tanabe, Y.; Nakatsuka, Y.; Sakai, S.; Miyazaki, T.; Nagahama, T.. Diluted Wet Oxidation: A Novel Technique for Ultra Thin Gate Oxide Formation. IEEE International Symposium on Semiconductor Manufacturing Conference Proceedings, Oct. 6–8, 1997. pp. P49–P52.*

* cited by examiner

Primary Examiner—Olik Chaudhuri
Assistant Examiner—Ginette Peralta
(74) Attorney, Agent, or Firm—Tung & Associates

(57) ABSTRACT

A method for forming an oxide layer on an electronic substrate such as a process of forming an ultra-thin gate oxide layer on a silicon wafer and an apparatus for executing for such method are provided. In the method, a moisture generator is continuously heated after a water vapor generating process is completed in order to prevent any residual moisture from condensing on an inner wall of the moisture generator. The method thus prevents additional water vapor from being communicated to an oxidation furnace and causing a continuous, undesirable growth of oxide on the wafers. The method may further be improved by flowing an inert gas into the oxidation chamber at a location adjacent to the oxidation chamber such that a substantially moisture-free inert gas flow may be flown into the chamber to improve the temperature uniformity in the chamber and to pressurize the chamber for preventing moisture or other contaminating gases from entering the chamber from the outside ambient. The apparatus includes a sub-heater mounted on the moisture generator in addition to a main heater for providing heat for the pyrolysis reaction of producing water vapor, and an inlet for the inert gas at a location immediately adjacent to the oxidation chamber such that the passageway of the inert gas to the chamber is minimized to reduce the chances for the inert gas to pick up moisture along the way to the oxidation chamber.

17 Claims, 2 Drawing Sheets

METHOD FOR FORMING A GATE OXIDE LAYER

FIELD OF THE INVENTION

The present invention is generally related to a method and apparatus for forming an oxide layer on an electronic substrate and more particularly, is related to a method and apparatus for forming a thin gate oxide layer on a silicon wafer that has improved process control capability such that a precise thickness of the oxide layer can be obtained.

BACKGROUND OF THE INVENTION

In the semiconductor fabrication process, one of the more important processing steps is the formation of a gate oxide layer for insulating a gate structure on a silicon substrate. Generally, silicon dioxide layers can be grown in a temperature range between 400° C. and 1150° C. The growth process can be carried out in resistance-heated furnaces or in rapid-thermal process chambers with heat provided by, for instance, tungsten-halogen lamps. Typically, either a horizontal or a vertical furnace tube can be used for such purpose. After a batch of wafers is first loaded into a furnace either in a horizontal or in a vertical position, the furnace is heated (or ramped-up) to an oxidation temperature of silicon. The wafers are held at the elevated temperature for an extended length of time and then brought back (or ramped-down) to a low temperature.

The silicon dioxide layers can be grown in either a dry oxidation process or a wet oxidation process. In a dry oxidation process, oxygen mixed with an inert carrier gas such as nitrogen is passed over the wafers at an elevated temperature. In a wet oxidation process, the process can be carried out by bubbling oxygen through a high purity water that is maintained at a temperature of approximately 90° C. The temperature of the water bath determines the partial pressure of water vapor in the oxygen gas stream. The water vapor/oxygen gas mixture is then passed over the batch of wafers maintained at a preset elevated temperature. The wet oxidation process may also be carried out in a pyrogenic steam oxidation process in which the oxidizing medium is water vapor formed by a direct reaction between hydrogen and oxygen. A typical pyrogenic steam oxidation apparatus 10 is shown in FIG. 1.

As shown in FIG. 1, a typical pyrogenic steam oxidation process can be carried out in a horizontal furnace tube 12 which is situated in a furnace 14. Inside the furnace tube 12, a wafer bolt 16 is used to hold a batch of wafers 20 in an upright position. Oxygen gas 22 is fed into the furnace tube 12 by a carrier inert gas 24 (such as nitrogen) through an inlet 26. A separate flow 28 of hydrogen is fed into the furnace tube at another inlet 30. Water vapor is thus formed by a direct reaction between hydrogen and oxygen in the furnace tube 12 as an oxidizing medium to produce silicon dioxide on the silicon wafers 20. Unused water vapor and other reaction by-products are flown out of the furnace tube 12 through outlet 32.

The thermal budget required to achieve an oxide film of a certain thickness is considerably smaller in a wet oxidation process than in a dry oxidation process. Since the smallest fabricated dimension in a semiconductor device is frequently the gate-oxide thickness, the process control of a pyrogenic steam oxidation method is more difficult than that of a dry oxidation method. For instance, in a 0.35 $\mu$m device, a 70 Å gate oxide thickness must be controlled to within 7 Å in order to meet stringent reliability requirements, i.e., one of such requirements is a defect density of smaller than 0.5/cm$^2$. A process that manufactures devices that have ultra-thin oxide layers therefore requires careful process control and oxidation-furnace optimization. As the diameter of silicon wafers becomes larger, i.e., increased from 150 mm to 200 mm or 300 mm diameter, larger furnace tubes must be utilized which further complicates the ambient control process. Furthermore, as device dimensions are further reduced to the sub 0.25 $\mu$m level, the thickness of the gate oxide layers is also reduced to about 50 Å. An ultra-thin gate oxide layer of 50 Å is very difficult to control when it is grown in a pyrogenic steam oxidation process such as that shown in FIG. 1. One major reason for such difficulty is simply that the pyro-time required for depositing such ultra-thin layer of oxide is too short. Another reason for such difficulty is a higher than normal annealing temperature used on the ultra-thin oxide layers which is necessary to obtain high quality oxide material. The annealing process is normally conducted at a temperature of about 1000° C. At such high temperature, any residual moisture in the reaction chamber or in a conduit leading to the reaction chamber may cause to further oxide growth on the wafers and thus throwing the oxide thickness out of specification.

The process control difficulty occurring in an ultra-thin oxide deposition process can be illustrated in FIG. 2. The oxide thickness as deposited on silicon wafers in a vertical oxidation chamber are monitored and plotted during a two-months period. In FIG. 2, the notations of U, C and L denote wafer samples situated in an upper part of the furnace tube, in a center part of the furnace tube or in a lower part of the furnace tube. It is seen that while the pyrolysis time is maintained substantially constant, the oxide thicknesses vary greatly between about 40 Å and about 80 Å during the two-months monitoring period. Such fluctuation in the thicknesses of ultra-thin gate oxide layers cannot be tolerated. For instance, a maximum allowable deviation from a nominal thickness is well within 10%.

It is therefore an object of the present invention to provide a method for forming an oxide layer on an electronic substrate that does not have the drawbacks or shortcomings of the conventional methods.

It is another object of the present invention to provide an apparatus for forming an oxide layer on a silicon substrate that does not have the drawbacks or shortcomings of the conventional apparatus.

It is a further object of the present invention to provide a method for forming a thin oxide layer on a silicon wafer which has improved process control.

It is another further object of the present invention to provide a method for forming a thin gate oxide layer on a silicon wafer wherein the thickness of the oxide layer can be controlled to within 10% deviation.

It is still another object of the present invention to provide a method for forming an ultra-thin oxide layer on a silicon wafer by utilizing a sub-heater in combination with a primary heater for heating a moisture generator.

It is yet another object of the present invention to provide a method for forming an ultra-thin oxide layer on a silicon wafer by continuously heating a moisture generator after flows of hydrogen and oxygen into the generator have been stopped.

It is still another further object of the present invention to provide a method for forming an ultra-thin gate oxide layer on a silicon wafer by purging a flow of nitrogen that is substantially without moisture into an oxidation chamber during a high temperature annealing process for the gate oxide layer.

It is yet another further object of the present invention to provide a method for forming an ultra-thin gate oxide layer on a silicon wafer by continuously heating a moisture generator after flows of hydrogen and oxygen into the generator have been stopped and purging a substantially dry nitrogen gas through an oxidation chamber during a high temperature annealing process for the ultra-thin gate oxide layer.

It is still another further object of the present invention to provide an apparatus for forming a ultra-thin gate oxide layer on a silicon wafer that is equipped with a sub-heater on a moisture generator and a nitrogen purge gas inlet that is situated immediately adjacent to an oxidation chamber which enables a substantially moisture-free purge gas to be flown through the oxidation chamber during a high temperature annealing process.

SUMMARY OF THE INVENTION

In accordance with the present invention, a method for forming an oxide layer on electronic substrates and an apparatus for conducting such method are provided.

In a preferred embodiment, a method for forming an oxide layer on an electronic substrate can be carried out by the operating steps of loading at least one electronic substrate into an oxidation chamber, providing a moisture generator in fluid communication with the oxidation chamber, heating the moisture generator to a first temperature sufficient for generating $H_2O$ from $H_2$ and $O_2$, flowing gases of $H_2$ and $O_2$ into the moisture generator and generating $H_2O$, flowing the $H_2O$ into the oxidation chamber through a first conduit and forming an oxide layer on the at least one electronic substrate, stopping the flow of gases of $H_2$ and $O_2$, and continuously heating the moisture generator and substantially preventing the condensation of $H_2O$ on an inner wall of the moisture generator.

In the method, the oxidation chamber can be a pyrogenic steam oxidation chamber. The oxidation chamber may also be a vertical oxidation chamber. The first temperature that is sufficient to generate $H_2O$ vapor is at least 700° C., and preferably about 800° C. The gases of $H_2$ and $O_2$ are flown into the moisture generator by an inert carrier gas. One of such suitable inert carrier gas is nitrogen. The method may further include the step of purging the first conduit and the oxidation chamber with an inert gas. The method may further include the step of annealing the oxide layers formed at an annealing temperature of at least 900° C., and preferably at a temperature of about 1000° C.

In another preferred embodiment, a method for depositing a gate oxide layer on a wafer with improved process control capability can be carried out by the operating steps of first loading at least one wafer into an oxidation chamber, then providing a moisture generator in fluid communication with the oxidation chamber, then heating the moisture generator to a first temperature sufficient for generating $H_2O$ vapor from $H_2$ and $O_2$, then flowing gases of $H_2$ and $O_2$ into the moisture generator and generating $H_2O$ vapor, then flowing the $H_2O$ vapor into the oxidation chamber through a first conduit and forming an oxide layer on the at least one wafer, then stopping the flow of gases of hydrogen and oxygen, then continuously heating the moisture generator to substantially prevent the condensation of moisture on an inner wall of the moisture generator, and finally purging the first conduit and filling the oxidation chamber with an inert gas.

The oxidation chamber utilized in the method may be a pyrogenic steam oxidation chamber. The first temperature that is sufficient to generate $H_2O$ vapor is between about 700° C. and about 1000° C. The gases of $H_2$ and $O_2$ are flown into the moisture generator by an inert carrier gas, including nitrogen. The method may further include the step of purging the first conduit and filling the oxidation chamber with dry nitrogen. The method may further include the step of purging the first conduit and filling the oxidation chamber with an inert gas through a gas inlet mounted adjacent to the oxidation chamber. The method may still further include the step of annealing the oxide layers formed at an annealing temperature between about 800° C. and about 1200° C.

The present invention is further directed to an apparatus for depositing a gate oxide layer on a silicon wafer with improved process control which includes an oxidation chamber, a moisture generator in fluid communication with the oxidation chamber, a first means for heating the moisture generator to a first temperature that is sufficient for generating $H_2O$ vapor from $H_2$ and $O_2$, a second means for heating the moisture generator to a second temperature sufficient for preventing moisture condensation on an inner wall of the moisture generator, a means for flowing gases of $H_2$ and $O_2$ into the moisture generator and generating $H_2O$ vapor, a first conduit for flowing $H_2O$ into the oxidation chamber and forming an oxide layer on the at least one wafer, and a second conduit for flowing an inert gas into the oxidation chamber, the second conduit is mounted juxtaposed to the oxidation chamber to a gas inlet on the chamber such that inert gas that is substantially without moisture can be flown into the chamber.

The first temperature achieved in the moisture generator that is sufficient for generating $H_2O$ vapor from $H_2$ and $O_2$ gases is between about 700° C. and about 1000° C. The second temperature sufficient for preventing moisture condensation on an inner wall of the moisture generator is at least 100° C., and preferably at least 120° C. The first means and the second means for heating the moisture generator may be the same heating apparatus that is equipped with a temperature controller. The second conduit for forming an inert gas into the oxidation chamber can be mounted immediately adjacent to the oxidation chamber to a gas inlet on the oxidation chamber. The second conduit for flowing an inert gas into the oxidation chamber may also be advantageously mounted directly to the oxidation chamber without going through a gas inlet.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENTS

Figure 1:
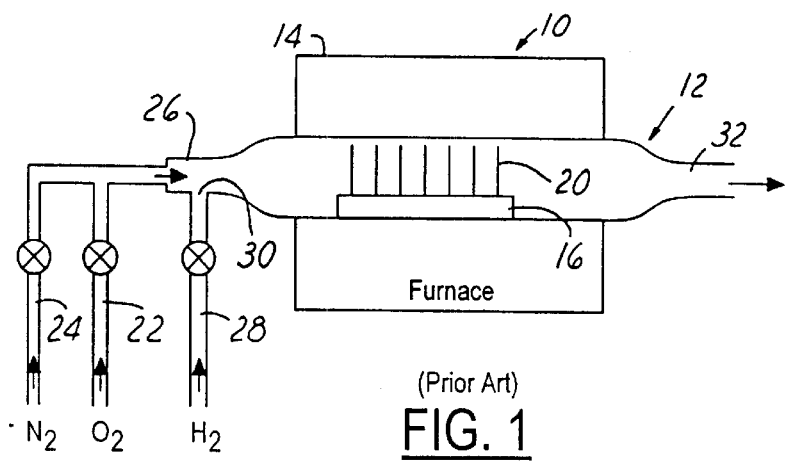
FIG. 1 is an illustration of a conventional apparatus used in a pyrogenic steam oxidation process.

The present invention discloses a method for forming an ultra-thin gate oxide layer on silicon wafers that has improved process control capability such that a gate oxide layer having a thickness of about 50 Å can be deposited in a process. The present invention is further directed to an apparatus for forming ultra-thin gate oxide layers on silicon wafers that incorporates a sub-heater mounted to a moisture generator and an inert gas purge inlet mounted immediately adjacent to an oxidation chamber for purging a conduit and filling the chamber with a substantially dry inert gas. The method and apparatus can be advantageously used in depositing oxide layers on any electronic substrate, and is particularly suitable for depositing ultra-thin gate oxide layers in the thickness range of about 40 Å~60 Å.

In a conventional process of depositing gate oxide layers on integrated circuit chips, the layer deposited normally has a thickness in the range between about 70 Å and about 100 Å. In such thickness range, the process for an oxidation process can be easily controlled. However, in modern high density integrated circuit devices, particularly in the sub-0.25 µm devices, the thickness of the gate oxide layer has been reduced to approximately 50 Å. At such small thickness, the oxidation/deposition process for the oxide layers becomes extremely difficult. The difficulties for the process control are further complicated by the fact that larger size wafers are now being used, i.e., the 200 mm or the 300 mm diameter wafers are coming on stream in the near future. The larger the wafer size, the larger the oxidation furnace tube must be utilized to accommodate the wafers. A precise temperature control and an achievement of uniform temperature inside the furnace tube become very difficult which further complicates the task of obtaining thickness control on the oxide layers.

For achieving a high quality ultra-thin gate oxide layer, i.e., in the thickness range of about 50 Å, a high temperature post-deposition annealing process should be performed. While an annealing process is normally conducted at about 900° C. in conventional methods for oxide layers between 70 Å and 100 Å thick, a higher annealing temperature in the range of about 1000° C. is more desirable for the ultra-thin gate oxide layer. At such high annealing temperature, any residual moisture left in the ambient of the oxidation furnace may easily oxidize the silicon layer into silicon dioxide. The task of maintaining the ultra-thin gate oxide layers at around 50 Å thickness therefore becomes more difficult when residual moisture is present in the furnace tube. The problem is not as severe in the conventional oxidation method wherein the lower annealing temperature of 900° C. is used.

The present invention novel method and apparatus are used advantageously to control the thickness of an ultra-thin gate oxide layer deposited on a silicon wafer. The method is carried out by continuously heating a moisture generator after flows of hydrogen and oxygen gases into the generator have been stopped. The heated inside wall of the generator therefore prevents any possible condensation of water vapor on the wall which may become additional, unwanted water supply to the oxidation chamber that is in fluid communication with the moisture generator. The continuous heating of the inner wall of the moisture generator can be achieved by a sub-heater mounted to the generator which is in addition to a main heater of typically IR lamps.

In an alternate embodiment, the sub-heater is turned on before the main heater is turned on such that the inner wall of the generator can be preheated to dry off any residual moisture that may have deposited on the wall from a previous deposition cycle. The sub-heater is then left on after the main heater, i.e., the IR lamps are turned off for a sufficient length of time to prevent moisture condensation on the inner wall of the generator.

In another alternate embodiment, an inert gas flow such as nitrogen is introduced to the oxidation chamber at a location that is juxtaposed to the oxidation chamber. Among the benefits of using the inert gas purging process, at least two major benefits are achieved by the present invention novel method. First, the inert gas is flown into the oxidation chamber, particularly during the high temperature annealing process, to act as a heating medium for achieving a more uniform temperature distribution inside the oxidation chamber. This is important since, in order to increase yield and to reduce processing time, longer furnace tubes of either the horizontal design or the vertical design are being used which makes it more difficult to achieve temperature uniformity in the tube. The inert gas flown into a long furnace tube therefore helps to distribute heat and to achieve temperature uniformity in the tube. Secondly, the inert gas flown into the oxidation chamber fills up the chamber interior and thereby pressurize the chamber interior relative to the ambient outside the oxidation chamber. As a result, there is always a positive pressure inside the oxidation chamber when compared to the ambient that surrounds the chamber. The positive pressure maintained inside the oxidation chamber therefore prevents moisture or other contaminating gases in the ambient from entering the chamber and thus preventing possible contamination of the wafers. This is highly desirable since any contamination of the wafers may drastically reduce the yield of the fabrication process.

The sub-heater utilized may be a resistance type of heating coils arranged around the moisture generator as a supplemental heating device to the generator. The main heater for the moisture generator such that the interior of the generator may be heated to about 800° C. for producing $H_2O$ vapor from $H_2$ and $O_2$ gases are usually lamps such as those operating in the IR frequency range. The sub-heater is capable of maintaining the chamber interior at a temperature of at least 100° C., or preferably at least 120° C. such that no residual $H_2O$ vapor condenses on the inner wall of the moisture generator and becomes additional water supply to the oxidation chamber since the two chambers are in fluid communication with each other.

To improve the present invention method, the present invention apparatus may further be equipped with an inert gas inlet that is mounted juxtaposed to the oxidation chamber for feeding an inert gas into the chamber. Since the inert gas is fed into the oxidation chamber through a minimal length of conduit, a substantially moisture-free inert gas can be fed into the oxidation chamber to act as a heating medium and as a pressurizing agent for the chamber interior. A present invention apparatus is shown in FIG. 3.

Figure 3:
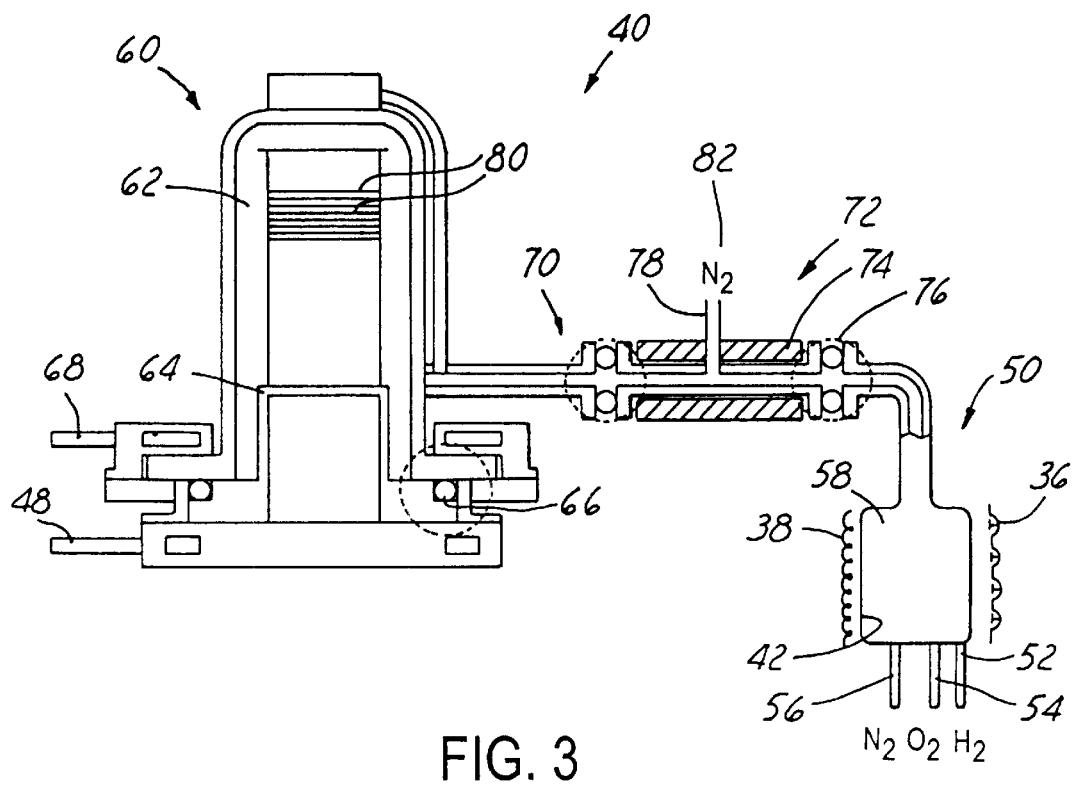
FIG. 3 is an illustration of the present invention apparatus incorporating a sub-heater and an inert gas inlet mounted juxtaposed to an oxidation chamber.

FIG. 3 shows a present invention apparatus 40 consisting essentially of a moisture generator 50, an oxidation chamber 60 and a conduit 70 providing fluid communication between the two. As shown in FIG. 3, the conduit 70 consists of a heated section 72 equipped with a resistance-type heater 74, an 0-ring type seal 76 and an inert gas inlet 78. While the length of conduit 70 should be minimized in order to minimize the chances of moisture cumulation in the conduit, the control of its length is sometimes limited by how the oxidation chamber 60 and the moisture generator 50 are positioned in a fabrication facility. The use of a heater 74 is therefore desirable in order to maintain the conduit 70 at an elevated temperature such that moisture condensation in the conduit can be minimized. While heater 74 helps to prevent moisture condensation in conduit 70, it is still desirable that the distance between the inert gas inlet 78 and the oxidation chamber 60 to be minimized. The inert gas 82 which enters the inlet 78 should travel as short a distance in the conduit 70 as possible to minimize the amount of moisture it picks up in conduit 70 during the high temperature annealing process.

The moisture generator 50 is equipped with a number of gas inlets 52, 54 and 56 for various gas inputs such as hydrogen, oxygen and an inert gas of nitrogen, respectively. The oxygen gas can be fed through inlet 54 carried by an inert gas that is fed through inlet 56 into chamber cavity 58 and then react with a hydrogen gas which is fed into the chamber through inlet 52. In a conventional method, in order to slow down the deposition process for the oxide layer, only low flow rates for oxygen and hydrogen can be used so that only a small flame is produced in chamber 58 for generating water vapor. At such low flow rates for the hydrogen and oxygen gas, the flow of the nitrogen carrier gas may need to be shut off in order not to put out the small flame for the pyrolysis reaction. The main heater 36 for the moisture generator 50 is normally a quick heating device such as heating lamps. A suitable heating lamp for such purpose may operate in the IR frequency range.

The present invention further provides a sub-heater 38 which may be of the resistance type such that chamber 58 may be continuously heated at a temperature of at least 100° C. after the flow of hydrogen and oxygen into the chamber has been stopped. The continuous heating of the internal wall 42 of chamber 58 substantially prevents any moisture condensation on the wall 42. More importantly, sub-heater 38 prevents any possible moisture condensation on the inner wall 42 from being carried into the oxidation chamber 60 by the nitrogen carrier gas which is fed into chamber 58 from inlet 56. This greatly improves the process control of the oxidation process in chamber 62 of the oxidation chamber 60, particularly during the high temperature annealing cycle.

The sub-heater 38 may further be utilized as a pre-heating device for the moisture generator 50 such that any residual moisture left from the previous deposition cycle can be removed by purging nitrogen gas through the moisture generator 50 prior to turning on the flows of hydrogen and oxygen.

For instance, the pre-heating step may last for approximately ten minutes prior to the turning on of main heater 36 for heating the moisture generator chamber 58. The afterbake process effected by the sub-heater 38 may last for a time period of at least about 20 minutes, and preferably for about 55 minutes to ensure the internal wall 42 of the moisture generator 50 is heated.

The oxidation chamber 60 is normally heated by resistance-type heaters (not shown) such that an annealing process for the ultra-thin oxide layers at a temperature between about 800° C. and about 1200° C. can be carried out. A temperature that is frequently used for such high temperature annealing process is about 1000° C. Since the moisture generator 50 is normally operated at a temperature of about 800° C., water vapor produced or any residual water vapor left in generator 50 reacts rapidly with silicon at the high annealing temperature of 1000° C. maintained in the oxidation chamber 60, when such residual moisture is not prevented or removed from the generator 50 by the present invention method.

The oxidation chamber 60 is constructed of a chamber interior 62 and an elevator 64 for moving the wafer 80 up and down or into and out of position in the chamber. The oxidation chamber 60 is further isolated from its ambient by an O-ring seal 66, as shown in FIG. 3. Cooling water inlet 68 and outlet 48 are provided for controlling the temperature of the oxidation chamber 60.

It should be noted that while the inert gas inlet 78, as shown in FIG. 3, is channeled through the heater 72, the location of the inert gas inlet 78 should be as close to the oxidation chamber 60 as possible. For instance, instead of flowing an inert gas into conduit 70, the inert gas inlet 78 may be channeled directly into the oxidation chamber 60 without going through a conduit 70. The inert gas inlet 78 may further be channeled into the conduit 70 at a location that is immediately adjacent (not shown) to the oxidation chamber 60. The purpose is to minimize the distance of travel for any inert gas that is fed through inlet 78 such that the chances of picking up moisture content along the way is greatly reduced.

In carrying out the present invention novel method, a batch of wafers 80 is first loaded into the oxidation chamber 60 and then elevated into the chamber interior 62 which is maintained at a temperature similar to the interior of the moisture generator 50, i.e., at about 800° C. Water vapor is then generated in the moisture generator 50 at a temperature higher than 700° C., and preferably at about 800° C. by flowing into the generator interior 58 a hydrogen gas and an oxygen gas. Depending on the flow rates of the reactant gases, an inert gas flow of nitrogen through inlet 56 may also be used.

In the next step of the present invention novel process, $H_2O$ vapor is generated in the moisture generator 50 and flown into the chamber interior 62 of the oxidation chamber 60 through conduit 70. An ultra-thin gate oxide layer, i.e., in the thickness range of about 50 Å, is then formed on wafers 80 that are positioned in the chamber interior 62. The formation temperature is about 800° C. which is similar to the temperature at which the water vapor is generated in the moisture generator 50. The flows of reactant gases of hydrogen and oxygen through conduits 52, 54 into the moisture generator 50 are then stopped, while the moisture generator is continuously heated by the sub-heater 38 (with the main heater 36 shut off). The continuous heating of the inner wall 42 of the moisture generator 50 by the sub-heater 38 for a time period of at least 20 minutes, and for as long as 55 minutes, prevents moisture condensation on the inner wall 42 and thus no residual moisture may be carried into the oxidation chamber by the inert gas.

Figure 2:
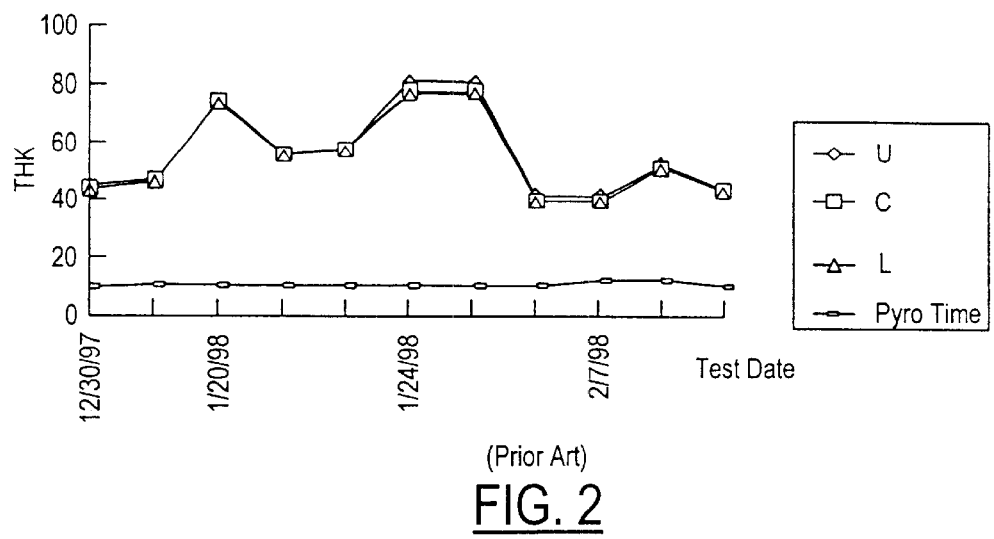
FIG. 2 is a graph illustrating variations in the oxide thicknesses deposited during a two-months period when the deposition is carried out in a conventional apparatus.
Figure 4:
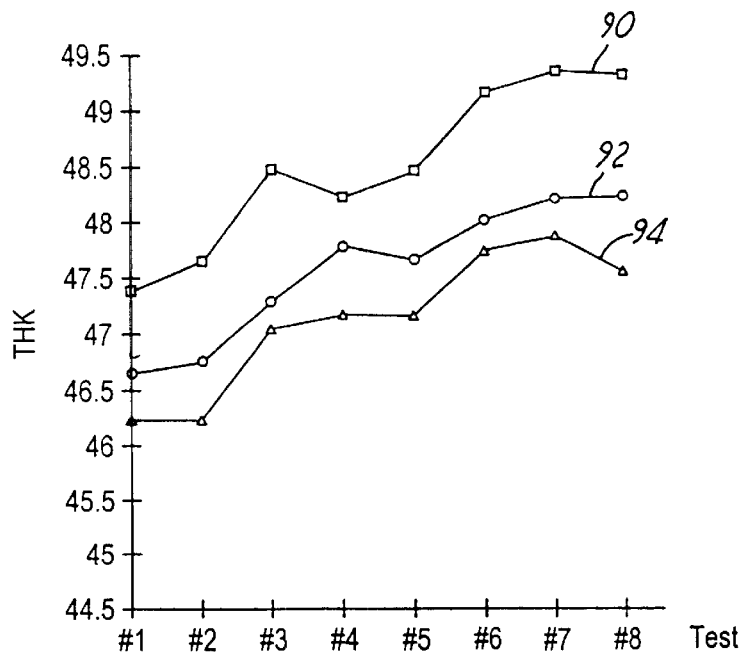
FIG. 4 is a graph illustrating thickness variations in the oxide layers deposited on different batches of wafers by the present invention method incorporating a sub-heater to after-bake the moisture generator.

FIG. 4 is a graph illustrating the effect of the present invention novel method of utilizing a sub-heater in combination with a moisture generator. It is seen that the upper line 90 indicates data obtained at an upper portion of the vertical oxidation chamber 60 shown in FIG. 3, while the middle line 92 and the lower line 94 represents data obtained on wafers situated in a middle portion and in a lower portion of the oxidation chamber, respectively. It is noted that, overall, a larger thickness of oxide is formed on wafers situated in an upper part of the furnace tube than in a lower part of the furnace tube which is expected. The variations in the oxide thicknesses measured during different tests is well within 10%, or about 5% of the average oxide thickness which is readily acceptable in the IC fabrication industry. It is noted that this variation is a great improvement over that previously observed in wafers processed by the conventional method as shown in FIG. 2.

Figure 5:
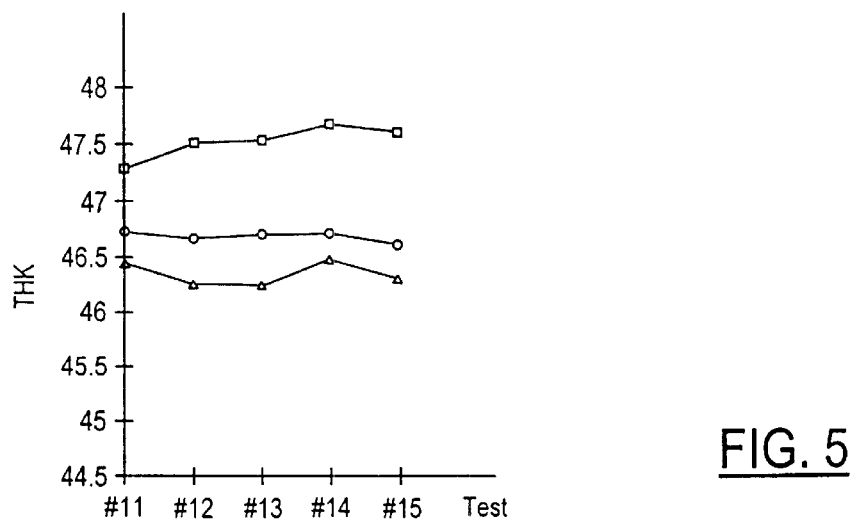
FIG. 5 is a graph illustrating thickness variations in oxide layers deposited on different batches of wafers by the present invention method incorporating an after-bake process and a dry nitrogen purge process.

In an alternate embodiment of the present invention, the present invention novel method for depositing an ultra-thin gate oxide layer on a silicon wafer may further be improved by positioning an inert gas inlet adjacent to an oxidation furnace. The data obtained with such an inert gas inlet installed in close proximity to an oxidation chamber is shown in FIG. 5. The upper line 96, the middle line 98 and the lower line 100 represents oxide thickness measurements on wafers situated at an upper part, at a middle part and at a lower part of the furnace tube, respectively. It is seen that, in combining the present invention novel methods of continuously heating the moisture generator and purging the oxidation chamber with an inert gas through an inlet in close proximity to the chamber, a greatly improved and unexpected result shown by the substantially uniform oxide layers formed is obtained. The variation in the oxide thickness measured among the various test samples is less than 1% deviation from an average thickness. The result is only made possible by the present invention alternate embodiment in which a combination of after-baking the moisture generator and close proximity purging of the oxidation furnace by an inert gas is used.

The present invention novel method can be practiced by either using a sub-heater on a moisture generator alone, or by a process combining the use of a sub-heater on a moisture generator and an inert gas purge inlet that is installed in close proximity to an oxidation chamber. The present invention process can be easily with a minimal modification on an existing apparatus. The changes required in an existent process recipe is also minimal. The present invention novel method may further be enhanced by incorporating a preheating step utilizing a sub-heater mounted on the moisture generator prior to the moisture generating process.

The present invention novel method and apparatus has therefore been amply demonstrated in the previous descriptions and in the appended drawings of FIGS. 3~5. It should be noted that while a gate oxide deposition process has been illustrated as an example for implementing the present invention novel method and apparatus, the method and apparatus can be applied equally well to any other oxide deposition processes wherein a precise process control is desirable. In applying the present invention novel method to a gate oxide deposition process, the total deposition time may be increased from approximately 12 minutes to 22 minutes. The increase enables a more reliable control of the process and a resulting narrower range of the oxide thickness obtained.

While the present invention has been described in an illustrative manner, it should be understood that the terminology used is intended to be in a nature of words of description rather than of limitation.

Furthermore, while the present invention has been described in terms of a preferred and alternate embodiments, it is to be appreciated that those skilled in the art will readily apply these teachings to other possible variations of the inventions.

The embodiment of the invention in which an exclusive property or privilege is claimed are defined as follows:

1. A method for forming an oxide layer on an electronic substrate comprising the steps of:
   loading at least one electronic substrate into an oxidation chamber,
   providing a moisture generator in fluid communication with said oxidation chamber,
   heating said moisture generator to a fist temperature sufficient for generating $H_2O$ from $H_2$ and $O_2$,
   flowing gases of $H_2$ and $O_2$ into said moisture generator and generating $H_2O$,
   flowing said $H_2O$ into the oxidation chamber through a first conduit and forming an oxide layer on said at least one electronic substrate,
   stopping said flow of gases of hydrogen and oxygen, and
   continuously heating said moisture generator and substantially preventing the condensation of $H_2O$ on an inner wall of said moisture generator.

2. A method for forming an oxide layer on an electronic substrate according to claim 1, wherein said oxidation chamber is a pyrogenic steam oxidation chamber.

3. A method for forming an oxide layer on an electronic substrate according to claim 1, wherein said oxidation chamber is a vertical oxidation chamber.

4. A method for forming an oxide layer on an electronic substrate according to claim 1, wherein said first temperature sufficient to generate $H_2O$ is at least 700° C.

5. A method for forming an oxide layer on an electronic substrate according to claim 1, wherein said first temperature sufficient to generate $H_2O$ is about 800° C.

6. A method for forming an oxide layer on an electronic substrate according to claim 1, wherein said gases of $H_2$ and $O_2$ are flown into said moisture generator by an inert carrier gas.

7. A method for forming an oxide layer on an electronic substrate according to claim 1, wherein said gases of $H_2$ and $O_2$ are flown into said moisture generator by nitrogen gas.

8. A method for forming an oxide layer on an electronic substrate according to claim 1 further comprising the step of purging said first conduit and said oxidation chamber with an inert gas.

9. A method for forming an oxide layer on an electronic substrate according to claim 1 further comprising the step of annealing said oxide layers formed at a temperature of at least 900° C.

10. A method for forming an oxide layer on an electronic substrate according to claim 1 further comprising the step of annealing said oxide layers formed at a temperature of about 1000° C.

11. A method for forming a gate oxide layer on a wafer with improved process control comprising the steps of:
    loading at least one wafer into an oxidation chamber,
    providing a moisture generator in fluid communication with said oxidation chamber,
    heating said moisture generator to a first temperature sufficient for generating $H_2O$ from $H_2$ and $O_2$,
    flowing gases of $H_2$ and $O_2$ into said moisture generator and generating $H_2O$,
    flowing said $H_2O$ into the oxidation chamber through a first conduit and forming an oxide layer on said at least one wafer,
    stopping said flow of gases of hydrogen and oxygen,
    continuously heating said moisture generator to substantially prevent the condensation of $H_2O$ on an inner wall of said moisture generator, and
    purging said first conduit and filling said oxidation chamber with an inert gas.

12. A method for forming a gate oxide layer on a wafer with improved process control according to claim 11, wherein said oxidation chamber is a pyrogenic steam oxidation chamber.

13. A method for forming a gate oxide layer on a wafer with improved process control according to claim 11, wherein said first temperature sufficient to generate $H_2O$ is between about 700° C. and about 1000° C.

14. A method for forming a gate oxide layer on a wafer with improved process control according to claim 11, wherein said gases of $H_2$ and $O_2$ are flown into said moisture generator by an inert carrier gas.

15. A method for forming a gate oxide layer on a wafer with improved process control according to claim 11 further comprising the step of purging said first conduit and filling said oxidation chamber with dry nitrogen.

16. A method for forming a gate oxide layer on a wafer with improved process control according to claim 11 further comprising the step of purging said first conduit and said oxidation chamber with an inert gas through a gas inlet mounted adjacent to said oxidation chamber.

17. A method for forming a gate oxide layer on a wafer with improved process control according to claim 11 further comprising the step of annealing said oxide layers formed at a temperature between about 800° C. and about 1200° C.

* * * * *